United States Patent
Xiao et al.

(10) Patent No.: US 8,833,431 B2
(45) Date of Patent: Sep. 16, 2014

(54) ALUMINUM ALLOY MATERIAL AND METHOD OF MANUFACTURING ALUMINUM ALLOY BACKBOARD

(75) Inventors: Deyuan Xiao, Shanghai (CN); Richard Rugin Chang, Shanghai (CN); Mengjan Cherng, Shanghai (CN); Qing Rao, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 13/059,634

(22) PCT Filed: Dec. 30, 2010

(86) PCT No.: PCT/CN2010/080508
§ 371 (c)(1),
(2), (4) Date: Feb. 17, 2011

(87) PCT Pub. No.: WO2012/058847
PCT Pub. Date: May 10, 2012

(65) Prior Publication Data
US 2013/0216425 A1  Aug. 22, 2013

(30) Foreign Application Priority Data

Nov. 3, 2010  (CN) .......................... 2010 1 0530995

(51) Int. Cl.
*B22D 17/00* (2006.01)

(52) U.S. Cl.
USPC .............................. 164/113; 164/97; 148/549

(58) Field of Classification Search
USPC ..................................... 164/97, 113; 148/549
See application file for complete search history.

(56) References Cited

U.S. PATENT DOCUMENTS

2006/0155009 A1* 7/2006 Magario et al. ............... 523/210

FOREIGN PATENT DOCUMENTS

| CN | 2769680 Y | 4/2006 |
| CN | 1858143 A | 11/2006 |
| CN | 101707911 A | 5/2010 |
| CN | 101734650 A | 6/2010 |
| WO | WO 2010/091704 A1 | 8/2010 |

* cited by examiner

*Primary Examiner* — Roy King
*Assistant Examiner* — Janelle Morillo
(74) *Attorney, Agent, or Firm* — Blakely Sokoloff Taylor & Zafman

(57) ABSTRACT

The present invention discloses an aluminum alloy material, which is made of raw material of aluminum alloy. The raw material of aluminum alloy consists of the following constituents by percentage of weight: graphene: 0.1%~1%, carbon nano tube: 1%~5%, the rest being Al. The aluminum alloy material of the present invention has a good performance of heat dissipation, the thermal conductivity is higher than 200 W/m. Meanwhile, the present invention further provides a method of manufacturing aluminum alloy backboard, in which method, the raw material of aluminum alloy is heated and melted in a heating furnace, afterwards, the raw material of aluminum alloy after melting is formed into an aluminum alloy backboard by die-casting, in this way, the utilization rate of material is increased and the manufacturing cost of the backboard is reduced.

4 Claims, 1 Drawing Sheet

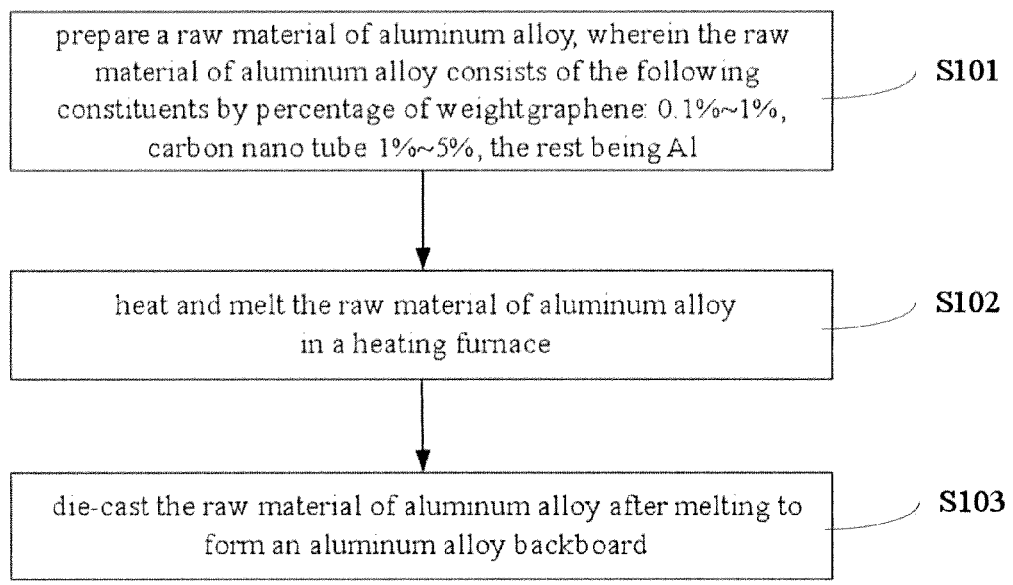

ALUMINUM ALLOY MATERIAL AND METHOD OF MANUFACTURING ALUMINUM ALLOY BACKBOARD

This is a non-provisional application claiming the benefit of International Application Number PCT/CN2010/080508 filed Dec. 30, 2010.

BACKGROUND OF THE INVENTION

1. Technical Field

The present invention relates to LED package technology, particularly to an aluminum alloy material and a method of manufacturing aluminum alloy backboard.

2. Description of Related Art

Light Emitting Diode (LED) is a semiconductor solid light emitting device, which utilizes semiconductor PN junction as the illuminant material to directly transform electricity into light. When a forward voltage is applied to both ends of the PN junction, the minority carriers and the majority carriers injected into the PN junction are recombined so as to release excessive energy and lead to photon emission, thereby emitting light with red, orange, yellow, green, cyan, blue or purple colors. LED light source, having the advantages of low energy consumption, long service life, environmental friendly and others, has become a hot research topic and is widely used in lighting equipments, and is regarded as the next generation light source.

LEDs are categorized into high-power LEDs and low-power LEDs according to the power supply. Generally, the nominal current of a low-power LED is 200 mA; those LEDs having a nominal current higher than 200 mA are basically considered as high-power LEDs.

High-power LED chips used for illumination generate large quantity of heat during use. Failure to duly disperse the heat will lead to unstable light output and severely affect the service life of the LED chips. In order to prolong the service life, LED chips are usually packaged on a backboard, which helps to disperse the heat generated during use. Meanwhile, a backboard is usually made of metal or alloy having excellent heat-conducting properties to improve the heat dissipation performance of the backboard. A lighting equipment is produced by welding the backside of an LED chip to a backboard.

Current backboards are made of materials as aluminum, aluminum alloy or copper. However, aluminum has poor heat-conducting properties, the thermal conductivity of which is only about 92 W/m or lower. Although copper has good heat-conducting properties, the disadvantages of using copper to produce backboards are severe distortion and high cost.

As for aluminum alloy, current aluminum alloy is usually ordinary industrial aluminum alloy, the ingredient of which mainly comprises Al, Si, Mg, Cu, etc., wherein the contents of Si and Mg are pretty high, as a result, the heat-conducting property of the aluminum alloy is poor. the thermal conductivity being no higher than 92 W/m, and the aluminum alloy is easy to distort after heated. Furthermore, forging is generally used as the method of manufacturing industrial aluminum alloy backboard.

Forging is a manufacturing process that imposes pressure on solid metal by using a forge press machine to cause plastic deformation of the solid metal so as to form forge pieces with certain mechanical property, certain shape and size. Since a forging process does not involve the step of melting, it is not easy to dope impurities into the material during the process; therefore, forging is mainly used to manufacture boards. For aluminum alloy, one needs to firstly prepare a solid aluminum alloy material, and then impose pressure on the solid aluminum alloy by using a forge press machine to cause plastic deformation of the solid aluminum alloy so as to form an aluminum alloy backboard with certain mechanical property, certain shape and certain size. The disadvantage of forging is low utilization rate of material, and boards might also be cracked during the process, so that the manufacturing cost of forging is rather high.

Therefore, it is necessary to improve the existing backboard material and the existing method of manufacturing backboard.

SUMMARY OF THE INVENTION

The purpose of the present invention is to provide an aluminum alloy material and a method of manufacturing aluminum alloy backboard to improve the heat-conducting properties of the backboard material and reduce the manufacturing cost of the backboard for LED chips.

To solve the abovementioned problem, the present invention provides an aluminum alloy material, wherein the aluminum alloy material is made of raw material of aluminum alloy, the raw material of aluminum alloy consists of the following constituents by percentage of weight:

graphene: 0.1%~1%, carbon nano tube: 1%~5%. the rest being aluminum.

Alternatively, the graphene is a single-layer graphite flake, a multilayer graphite flake, or a combination of single-layer graphite flake and multilayer graphite flake.

Alternatively, the carbon nano tube is a hollow tubular carbon material with 5~200 nm in diameter and 0.1~100 μm in length.

Alternatively, the thermal conductivity of the aluminum alloy material is higher than 200 W/m.

Meanwhile, to solve the abovementioned problem, the present invention further provides a method of manufacturing aluminum alloy backboard, which comprises the following steps:

preparing a raw material of aluminum alloy, wherein the raw material of aluminum alloy consists of the following constituents by percentage of weight:

graphene: 0.1%~1%, carbon nano tube: 1%-5%, the rest being aluminum;

heating and melting the raw material of aluminum alloy in a heating furnace;

die-casting and shaping the raw material of aluminum alloy after melting to form an aluminum alloy backboard.

Alternatively, the graphene is a single-layer graphite flake, a multilayer graphite flake, or a combination of single-layer graphite flake and multilayer graphite flake.

Alternatively, the carbon nano tube is a hollow tubular carbon material with 5~200nm in diameter and 0.1~100 μm in length.

Alternatively, the thermal conductivity of the aluminum alloy material is higher than 200 W/m.

With the adoption of the technical solution above, compared with the prior art, the present invention has the following advantages:

1) the aluminum alloy material according to the present invention has good heat-conducting properties and excellent heat dissipation performance;

2) the aluminum alloy material according to the present invention has a high thermal stability and is not prone to distort after heated;

3) the method of manufacturing aluminum alloy backboard according to the present invention adopts die-casting process, in this way the material utilization rate is high and the manufacturing cost is low.

BRIEF DESCRIPTION OF THE DRAWINGS

FIG. 1 is a flow chart of the manufacturing method of aluminum alloy backboard according to one embodiment of the present invention.

DETAILED DESCRIPTION OF THE INVENTION

The aluminum alloy material and the manufacturing method of aluminum alloy backboard of the present invention are further detailed by embodiments in combination with the drawings. By referring to the description and claims, features and merits of the present invention will be clearer to understand.

Graphene is a new carbon material composed of a sheet of carbon atoms bound together in a two-dimensional honeycomb-style lattice structure. Graphene provides the structural basis of carbon materials with other dimensions (e.g. zero-dimensional fullerene, three-dimensional graphite). Graphene has excellent electrical properties and thermal properties, the electron mobility at room temperature can reach 15000 $cm^2$/VS, the thermal conductivity can reach 3000 W/m, moreover, the price of graphene is low and the material is easy to obtain. However, graphene is likely to curl and distort due to its two-dimensional laminar structure.

Carbon Nano Tube (CNT) is a new carbon material, which can be regarded as a seamless hollow tube rolled by graphene. The length of a carbon nano tube ranges from several microns to several millimeters, and the diameter ranges from several nanometers to scores of nanometers. Because of its unique structure, carbon nano tube has significant advantages in the fields of mechanics and electricity, its anti-distortion capability is also remarkable.

The core spirit of the present invention is to provide an aluminum alloy material, which is made of raw material of aluminum alloy. The raw material of aluminum alloy consists of the following constituents by percentage of weight: graphene: 0.1%~1%, carbon nano tube: 1%~5%, the rest being aluminum (Al). The aluminum alloy material of the present invention has a good performance of heat dissipation, the thermal conductivity is higher than 200 W/m. Meanwhile, the present invention further provides a method of manufacturing aluminum alloy backboard, in which method, the raw material of aluminum alloy is heated and melted in a heating furnace, afterwards, the raw material of aluminum alloy after melting is shaped into an aluminum alloy backboard by die-casting, in this way, the utilization rate of material is increased and the manufacturing cost of the backboard is reduced.

The aluminum alloy material according to one embodiment of the present invention is made of raw material of aluminum alloy. The raw material of aluminum alloy consists of the following constituents by percentage of weight:

graphene: 0.1%~-1%. carbon nano tube: 1%~5%, the rest being Al.

Furthermore, the graphene is a single-layer graphite flake, a multilayer graphite flake, or a combination of single-layer graphite flake and multilayer graphite flake. Furthermore, the carbon nano tube is a hollow tubular carbon material, the diameter of which is 5~200 nm, the length of which is 0.1~100 μm.

The aluminum alloy material according to the present invention integrates the excellent thermal property of graphene with the good anti-distortion capacity of carbon nano tube; therefore, the aluminum alloy material of the present invention has excellent heat-conducting properties, which lead to good heat dissipation performance, as well as high thermal stabilities, which prevent the distortion of material after heated.

Furthermore, the thermal conductivity of the aluminum alloy material is higher than 200 W/m Please refer to FIG. 1, which is a flow chart of the manufacturing method of aluminum alloy backboard according to one embodiment of the present invention. As shown in FIG. 1, the method of manufacturing aluminum alloy backboard comprises the following steps:

S101: prepare a raw material of aluminum alloy, wherein the raw material of aluminum alloy consists of the following constituents by percentage of weight: graphene: 0.1%~1%, carbon nano tube: 1%~5%, the rest being Al. The aluminum alloy material prepared by the above recipe has a high thermal stability and is not easy to distort after heated.

S102: heat and melt the raw material of aluminum alloy in a heating furnace;

S103: die-cast the raw material of aluminum alloy after melting to form aluminum alloy backboard; in detail, the raw material of aluminum alloy after melting is filled into the chamber of a backboard die-casting mold, and is rapidly solidified and shaped under force of pressure so as to form an aluminum alloy backboard. As die-casting is a process of directly melting the raw material of aluminum alloy and casting the raw material of aluminum alloy after melting by using a backboard die-casting mold chamber, the raw material utilization rate is increased and the manufacturing cost is reduced.

Furthermore, the graphene is a single-layer graphite flake, a multilayer graphite flake, or a combination of single-layer graphite flake and multilayer graphite flake.

Furthermore, the carbon nano tube is a hollow tubular carbon material, the diameter of which is 5~200 nm, the length of which is 0.1~100 μm.

Furthermore, the material of the aluminum alloy backboard is the same as the aluminum alloy material mentioned above, and therefore the aluminum alloy backboard has an excellent heat dissipation performance with a thermal conductivity of over 200 W/m.

In application, a lighting equipment can be produced by connecting the aluminum alloy backboard with an LED chip.

According to one embodiment of the present invention, the aluminum alloy backboard as described is applied to LED chips, it shall be noted that according to the real circumstances, the aluminum alloy backboard can also be used as heat dissipating backboard for other chips. for example, as heat dissipating backboard for Organic Light Emitting Diode (OLED) chips.

To sum up, the present invention provides an aluminum alloy material, which is made of raw material of aluminum alloy. The raw material of aluminum alloy consists of the following constituents by percentage of weight: graphene: 0.1%~1%, carbon nano tube: 1%~5%, the rest being Al. The aluminum alloy material of the present invention has a good performance of heat dissipation, the thermal conductivity is higher than 200 W/m. Meanwhile, the present invention further provides a method of manufacturing aluminum alloy backboard, in which method, the raw material of aluminum alloy is heated and melted in a heating furnace, afterwards, the raw material of aluminum alloy after melting is shaped into an aluminum alloy backboard by die-casting, in this way, the utilization rate of material is increased and the manufacturing cost of the backboard is reduced.

It is clear that those skilled in the art may make various changes and deformations without deviating from the spirit and protection scope of the present invention. If such changes and deformations are within the scope of the claims and the equivalent technological scope, the present invention is also intended to include these changes and deformations.

What is claimed is:

1. A method of manufacturing aluminum alloy backboard, characterized in that, comprising the following steps:
preparing a raw material of aluminum alloy, wherein the raw material of aluminum alloy consists of the following constituents by percentage of weight: graphene: 0.1%~1%, carbon nano tube: 1%~5%, the rest being aluminum;
heating and melting the raw material of aluminum alloy in a heating furnace;
die-casting the raw material of aluminum alloy after melting to form an aluminum alloy backboard.

2. The method of manufacturing aluminum alloy backboard as claimed in claim 1, characterized in that, the graphene is a single-layer graphite flake, a multilayer graphite flake, or a combination of single-layer graphite flake and multilayer graphite flake.

3. The method of manufacturing aluminum alloy backboard as claimed in claim 1, characterized in that, the carbon nano tube is a hollow tubular carbon material with 5~200 nm in diameter and 0.1~100 μm in length.

4. The method of manufacturing aluminum alloy backboard as claimed in claim 1, characterized in that, the thermal conductivity of the aluminum alloy backboard is higher than 200 W/m° C.

* * * * *